United States Patent
Chiang et al.

(10) Patent No.: US 12,428,550 B2
(45) Date of Patent: Sep. 30, 2025

(54) RESIN COMPOSITION AND USES THEREOF

(71) Applicant: TAIWAN UNION TECHNOLOGY CORPORATION, Zhubei (TW)

(72) Inventors: Jen-Chi Chiang, Zhubei (TW); Meng-Huei Chen, Zhubei (TW)

(73) Assignee: Taiwan Union Technology Corporation, Zhubei (TW)

( * ) Notice: Subject to any disclaimer, the term of this patent is extended or adjusted under 35 U.S.C. 154(b) by 253 days.

(21) Appl. No.: 18/056,323

(22) Filed: Nov. 17, 2022

(65) Prior Publication Data
US 2024/0150567 A1 May 9, 2024

(30) Foreign Application Priority Data
Oct. 20, 2022 (TW) .................................. 111139912

(51) Int. Cl.
| | |
|---|---|
| C08L 25/08 | (2006.01) |
| C08J 5/24 | (2006.01) |
| H05K 1/03 | (2006.01) |
| H05K 1/05 | (2006.01) |
| B32B 5/02 | (2006.01) |
| B32B 5/26 | (2006.01) |
| B32B 15/14 | (2006.01) |
| B32B 15/20 | (2006.01) |

(52) U.S. Cl.
CPC .............. *C08L 25/08* (2013.01); *C08J 5/244* (2021.05); *H05K 1/0366* (2013.01); *H05K 1/056* (2013.01); *B32B 5/024* (2013.01); *B32B 5/263* (2021.05); *B32B 15/14* (2013.01); *B32B 15/20* (2013.01); *B32B 2255/02* (2013.01); *B32B 2255/06* (2013.01); *B32B 2255/26* (2013.01); *B32B 2260/021* (2013.01); *B32B 2260/046* (2013.01); *B32B 2262/101* (2013.01); *B32B 2457/08* (2013.01); *C08J 2325/08* (2013.01); *C08J 2425/10* (2013.01); *C08J 2471/12* (2013.01); *C08L 2205/03* (2013.01)

(58) Field of Classification Search
CPC .............................. C08L 25/08; C08J 2325/08
See application file for complete search history.

(56) References Cited

U.S. PATENT DOCUMENTS

| | | | | |
|---|---|---|---|---|
| 7,820,771 | B2 * | 10/2010 | Lapra | ........................ C08L 9/00 |
| | | | | 526/279 |
| 9,115,222 | B2 * | 8/2015 | Kitano | .................. C08F 299/02 |
| 2007/0155923 | A1 | 7/2007 | Kawabe | |
| 2021/0032404 | A1 * | 2/2021 | Shigaki | .................... B32B 15/20 |
| 2021/0070980 | A1 | 3/2021 | Zeng et al. | |

FOREIGN PATENT DOCUMENTS

| | | |
|---|---|---|
| TW | 200536862 A | 11/2005 |
| TW | 201736413 A | 10/2017 |
| TW | 201910412 A | 3/2019 |
| WO | 2017115813 A1 | 7/2017 |

OTHER PUBLICATIONS

Taiwanese Office Action ; 111139912; Issued Sep. 8, 2023.

* cited by examiner

*Primary Examiner* — Margaret G Moore
(74) *Attorney, Agent, or Firm* — Dunlap Bennett & Ludwig, PLLC; Anna L. Kinney

(57) ABSTRACT

A resin composition and the uses of it are provided. The resin composition comprises:
(A) a polyfunctional vinyl aromatic copolymer; and
(B) a diene compound, represented by the following formula (I)

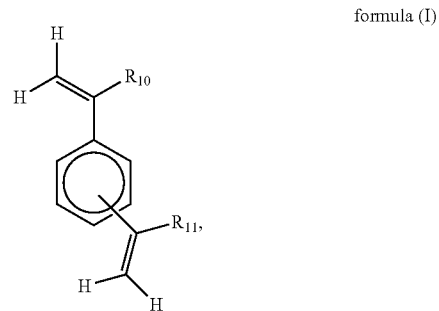

formula (I)

wherein, in formula (I), $R_{10}$ and $R_{11}$ are independently H, a C1-C6 linear or branched alkyl, with the proviso that $R_{10}$ and $R_{11}$ are not simultaneously H; and
the polyfunctional vinyl aromatic copolymer (A) is prepared by copolymerizing one or more divinyl aromatic compounds with one or more monovinyl aromatic compounds.

17 Claims, No Drawings

RESIN COMPOSITION AND USES THEREOF

CLAIM FOR PRIORITY

This application claims the benefit of Taiwan Patent Application No. 111139912 filed on Oct. 20, 2022, the subject matters of which are incorporated herein in their entirety by reference.

BACKGROUND OF THE INVENTION

Field of the Invention

The present invention provides a resin composition, especially a resin composition comprising a polyfunctional vinyl aromatic copolymer and a diene compound with a specific structure. The resin composition of the present invention can be used in combination with a reinforcing material to constitute a prepreg or be used as a metal foil adhesive to prepare a metal-clad laminate and a printed circuit board (PCB).

Descriptions of the Related Art

Due to the increased amount of information communication, information communication in the high-frequency band is actively developed. To pursue outstanding electric properties, especially to reduce the transmission loss in the high-frequency band, the dielectric material of printed circuit boards must have a low dielectric constant (Dk) and low dielectric loss factor (Df), and in particular, the variation of dielectric properties after moisture absorption must be low. In addition, the printed circuit boards and electronic components are exposed to reflow soldering at high temperature during mounting. Therefore, the dielectric material of printed circuit boards must have a high heat resistance and must have a high glass transition temperature. In particular, due to increased awareness of environmental issues, solder is required to be lead-free and thus has a high melting point. The dielectric material must have corresponding high heat resistance.

Various curable resins of vinyl-based compounds have been used given the above requirements. For example, TW 200536862 A teaches to perform a polymerization reaction of 20 mol % to 100 mol % of a divinyl aromatic compound with other optional monomers (such as monomers of ethyl vinyl aromatic compounds) in an organic solvent under the presence of a Lewis acid and an initiator at 20° C. to 120° C. to prepare a soluble polyfunctional vinyl aromatic copolymer with a specific molecular weight. A laminate prepared using the copolymer is acceptable in dielectric properties.

WO 2017-115813 A1 discloses a curable composition comprising a polyfunctional vinyl aromatic copolymer and a free radical initiator. The laminate prepared using the curable composition is acceptable in dielectric properties and is useful in the electric device requiring high functionality and mechanical properties.

A cross-linking agent with unsaturated functional groups and a resin with unsaturated groups are usually used in combination with a resin composition. An example of the aforementioned cross-linking agent with unsaturated functional groups includes triallyl isocyanurate (TAIC), and an example of the aforementioned resin with unsaturated groups includes polyphenylene ether resin which is modified at the terminals with unsaturated functional groups. TAIC can provide superior heat resistance and chemical resistance, but has a low boiling point (about 145° C., which is lower than the semi-curing temperature of a prepreg) and thus may evaporate during the preparation of laminates, which will result in inconsistency of the properties of the prepared electronic material.

SUMMARY OF THE INVENTION

Given the aforementioned technical problems, the present invention provides a resin composition that uses a polyfunctional vinyl aromatic copolymer and a diene compound with a specific structure. The electronic materials prepared from the cured product of the resin composition can have outstanding glass transition temperature (Tg), dielectric constant (Dk), dielectric loss factor (Df), adhesion to metal layer (peeling strength), PCT heat resistance, processing stability (filling property and tackiness), and water absorption.

Therefore, an objective of the present invention is to provide a resin composition, which comprises:
(A) a polyfunctional vinyl aromatic copolymer; and
(B) a diene compound, represented by the following formula (I)

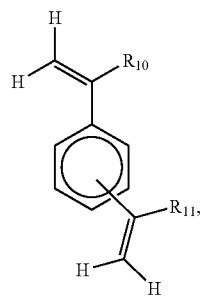

formula (I)

wherein, in formula (I), $R_{10}$ and $R_{11}$ are independently H, a C1-C6 linear or branched alkyl, with the proviso that $R_{10}$ and $R_{11}$ are not simultaneously H; and the polyfunctional vinyl aromatic copolymer (A) is prepared by copolymerizing one or more divinyl aromatic compounds with one or more monovinyl aromatic compounds.

In some embodiments of the present invention, the weight ratio of the polyfunctional vinyl aromatic copolymer (A) to the diene compound (B) is 5:1 to 1:2.5.

In some embodiments of the present invention, the polyfunctional vinyl aromatic copolymer (A) comprises a structural unit(s) selected from the group consisting of

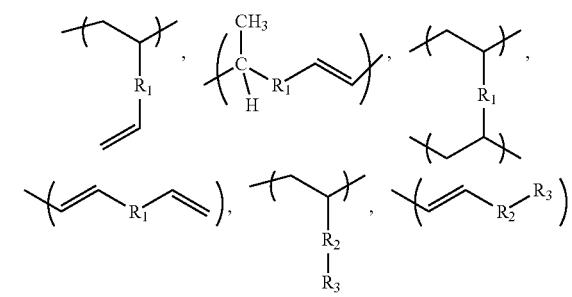

and combinations thereof,
wherein $R_1$ and $R_2$ are independently a C6-C12 aromatic hydrocarbyl, and $R_3$ is H or a C1-C12 hydrocarbyl.

In some embodiments of the present invention, the divinyl aromatic compound is selected from the group consisting of divinylbenzene, divinylnaphthalene, divinylbiphenyl, and isomers of the preceding compounds.

In some embodiments of the present invention, the monovinyl aromatic compound is selected from the group consisting of nuclear-alkyl-substituted vinyl aromatic compound, α-alkyl-substituted vinyl aromatic compound, β-alkyl-substituted vinyl aromatic compound, and alkoxyl-substituted vinyl aromatic compound, and combinations thereof.

In some embodiments of the present invention, the diene compound is selected from the group consisting of 1-isopropenyl-2-vinylbenzene, 1-isopropenyl-3-vinylbenzene, 1-isopropenyl-4-vinylbenzene, 1,2-diisopropenylbenzene, 1,3-diisopropenylbenzene, 1,4-diisopropenylbenzene, and combinations thereof.

In some embodiments of the present invention, the resin composition further comprises:
(C) a polyphenylene ether resin with unsaturated functional groups, and in some embodiments of the present invention, the polyphenylene ether resin (C) with unsaturated functional groups is represented by the following formula (II):

formula (II)

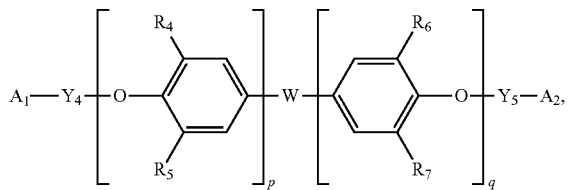

wherein, in formula (II),
$R_4$, $R_5$, $R_6$ and $R_7$ are independently H, or a substituted or unsubstituted C1-C5 alkyl;
p and q are independently an integer from 0 to 100, with the proviso that p and q are not 0 at the same time;
$Y_4$ and $Y_5$ are independently a direct bond, a carbonyl group, or an alkenyl-containing group;
$A_1$ and $A_2$ are independently

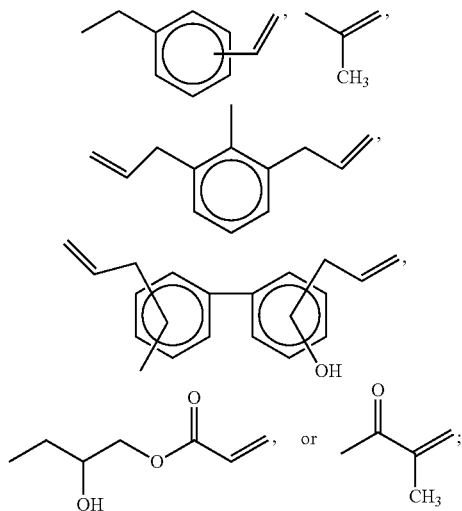

and
W is a direct bond, —O—,

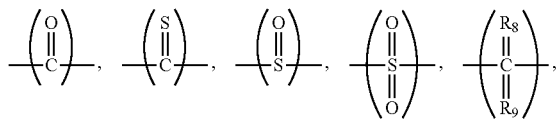

or an aryl, wherein $R_8$ and $R_9$ are independently H or a C1-C12 alkyl.

In some embodiments of the present invention, the resin composition further comprises:
(D) a compound having the structure of formula (III), formula (III)

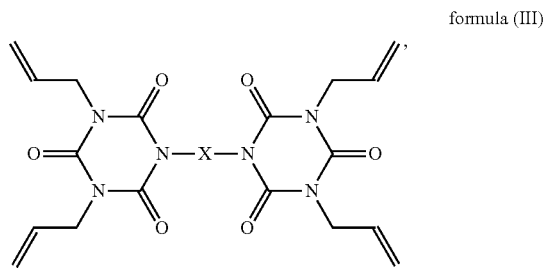

wherein, in formula (III), X is a C1-C10 linear or branched alkylene.

In some embodiments of the present invention, the resin composition further comprises an additive selected from the group consisting of catalysts, elastomers, fillers, dispersing agents, tougheners, viscosity modifiers, flame retardants, plasticizers, coupling agents, and combinations thereof.

In some embodiments of the present invention, the catalyst is selected from the group consisting of dicumyl peroxide, tert-butyl peroxybenzoate, di-tert-amyl peroxide (DTAP), isopropylcumyl-tert-butyl peroxide, tert-butylcumylperoxide, di(isopropylcumyl) peroxide, di-tert-butyl peroxide, α,α'-bis(tert-butylperoxy)diisopropyl benzene, benzoyl peroxide (BPO), 1,1-bis(tert-butylperoxy)-3,3,5-trimethylcyclohexane, 4,4-di(tert-butylperoxy)butyl valerate, 2,5-dimethyl-2,5-di(tert-butylperoxy)hexane, 2,5-dimethyl-2,5-di(tert-butylperoxy)-3-hexyne, and combinations thereof.

In some embodiments of the present invention, the elastomer is selected from the group consisting of polybutadiene, styrene-butadiene copolymer, styrene-butadiene-divinylbenzene copolymer, polyisoprene, styrene-isoprene copolymer, acrylonitrile-butadiene copolymer, acrylonitrile-butadiene-styrene copolymer, functional modified derivatives of the preceding compounds, and combinations thereof.

In some embodiments of the present invention, the filler is selected from the group consisting of silica, aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like carbon, graphite, calcined kaolin, pryan, mica, hydrotalcite, polytetrafluoroethylene powders, glass beads, ceramic whiskers, carbon nanotubes, nanosized inorganic powders, and combinations thereof.

Another objective of the present invention is to provide a prepreg prepared by impregnating a substrate with the aforementioned resin composition or by coating the aforementioned resin composition onto a substrate and drying the impregnated or coated substrate.

Yet another objective of the present invention is to provide a metal-clad laminate prepared by laminating the aforementioned prepreg and a metal foil or by coating the aforementioned resin composition onto a metal foil and drying the coated metal foil.

A further objective of the present invention is to provide a printed circuit board prepared from the aforementioned metal-clad laminate.

To render the above objectives, technical features, and advantages of the present invention more apparent, the present invention will be described in detail with reference to some embodiments hereinafter.

BRIEF DESCRIPTION OF THE DRAWINGS

Not applicable.

DESCRIPTION OF THE PREFERRED EMBODIMENTS

Hereinafter, some embodiments of the present invention will be described in detail. However, the present invention may be embodied in various embodiments, and the protection scope of the present invention should not be limited to those described in the specification.

Unless it is additionally explained, the expressions "a," "the," or the like recited in the specification and in the claims should include both the singular and the plural forms.

Unless it is additionally explained, while describing the amount of the components in the solution, mixture, composition, or varnish in the specification, the weight of the solvent is not included.

By using a polyfunctional vinyl aromatic copolymer together with a diene compound having a specific structure in the resin composition, the electronic material prepared from the cured product of the resin composition of the present invention can have outstanding glass transition temperature (Tg), dielectric constant (Dk), dielectric loss factor (Df), adhesion to metal layer (peeling strength), PCT heat resistance, processing stability (filling property and tackiness), and water absorption. The resin composition of the present invention and applications thereof are described in detail below.

1. RESIN COMPOSITION

The resin composition of the present invention comprises (A) a polyfunctional vinyl aromatic copolymer and (B) a diene compound with a specific structure as the essential components and may further comprise optional components. The detailed descriptions of the components are as follows.

1.1. (A) Polyfunctional Vinyl Aromatic Copolymer

As used herein, the polyfunctional vinyl aromatic copolymer (A) refers to a vinyl aromatic copolymer with at least three reactive vinyl groups. In the resin composition of the present invention, the polyfunctional vinyl aromatic copolymer undergoes crosslinking reaction with the other components having unsaturated functional groups via the reactive vinyl groups to form a stereo network structure. As used herein, the reactive vinyl groups include —CH=CH$_2$ and ethylene (—CH=CH—).

The polyfunctional vinyl aromatic copolymer (A) can be obtained by copolymerization of one or more divinyl aromatic compounds, one or more monovinyl aromatic compounds, and optionally, other monomers. The thus obtained polyfunctional vinyl aromatic copolymer has one or more reactive vinyl groups at the terminals and one or more reactive ethylene groups in the main chain, thereby capable of undergoing crosslinking reactions with other components having unsaturated functional groups.

In some embodiments of the present invention, the polyfunctional vinyl aromatic copolymer (A) may comprise the following structural units:

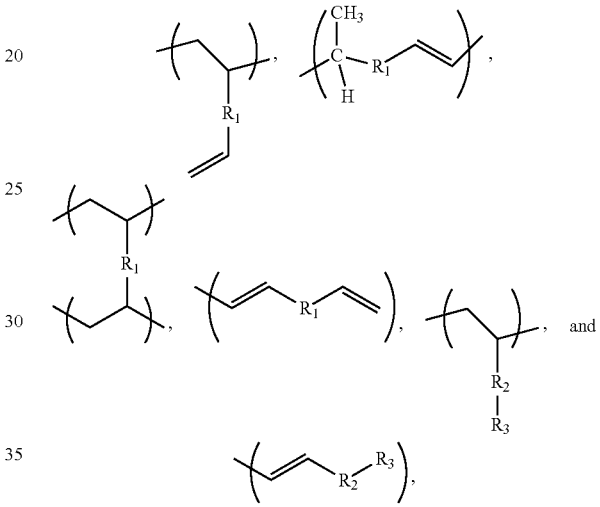

wherein $R_1$ and $R_2$ are independently a C6-C12 aromatic hydrocarbyl, and $R_3$ is H or a C1-C12 hydrocarbyl.

As used herein, a divinyl aromatic compound refers to an aromatic compound with two vinyl groups. Examples of the divinyl aromatic compound include but are not limited to divinylbenzene, divinylnaphthalene, divinyl-biphenyl, and isomers thereof. Each divinyl aromatic compounds can be used alone or in any combination. In some embodiments of the present invention, the divinyl aromatic compound is divinylbenzene; examples of divinylbenzene include but not are limited to m-divinylbenzene and p-divinylbenzene.

As used herein, a monovinyl aromatic compound refers to an aromatic compound with one vinyl group. Examples of the monovinyl aromatic compound include but are not limited to nuclear-alkyl-substituted vinyl aromatic compounds, α-alkyl-substituted vinyl aromatic compounds, β-alkyl-substituted vinyl aromatic compounds, and alkoxy-substituted vinyl aromatic compounds. Each monovinyl aromatic compounds can be used alone or in any combination. In some embodiments of the present invention, the monovinyl aromatic compound is one or more members selected from the group consisting of ethyl vinylbenzene, ethyl vinylnaphthalene, and ethyl vinyl-biphenyl, and is preferably ethyl vinylbenzene, wherein examples of ethyl vinylbenzene include but are not limited to m-ethyl vinylbenzene and p-ethyl vinylbenzene.

Examples of the optionally other monomers useful for preparing the polyfunctional vinyl aromatic copolymer (A) include but are not limited to trivinyl aromatic compounds, trivinyl aliphatic compounds, divinyl aliphatic compounds, and monovinyl aliphatic compounds. The amount of the optionally other monomers is preferably not higher than 50 mol %, more preferably not higher than 30 mol %, based on the total moles of the divinyl aromatic compounds, monovinyl aromatic compounds and the optionally other monomers. In other words, in the polyfunctional vinyl aromatic copolymer, the majority of the polymerization units are those derived from divinyl aromatic compounds and monovinyl aromatic compounds.

The Mw of the polyfunctional vinyl aromatic copolymer (B) can be 500 to 10,000, preferably 1000 to 5000. If the Mw of the polyfunctional vinyl aromatic copolymer is too high, such as higher than 10,000, the fluidity of the resin composition may degrade, which makes it difficult for subsequent processing. If the Mw of the polyfunctional vinyl aromatic copolymer is too low, such as lower than 500, the heat resistance of the prepared electronic material may degrade.

An example of the method for preparing the polyfunctional vinyl aromatic copolymer (A) may be described as follows: a method comprising copolymerizing the divinyl aromatic compound, the monovinyl aromatic compounds, and the optionally other monomers in the presence of a Lewis base compound and catalyst, wherein the catalyst is at least one member selected from the group consisting of inorganic acids, organic sulfonic acids, and perchlorates. The Lewis base compound acts as a promoter. During the polymerization reaction, the Lewis base compound can control the interaction between the catalyst and the hydrogen at β position of carbonium to regulate the relative reaction rate between the β-dehydrogenation reaction and the 1,2-addition reaction of vinyl groups. For more details of the preparation method of the polyfunctional vinyl aromatic copolymer (A), reference can be made to TW 201736413 A, which is incorporated herein in its entirety by reference.

Based on the solid content of the resin composition, the amount of the polyfunctional vinyl aromatic copolymer (A) can be 1 wt % to 30 wt %. For example, based on the solid content of the resin composition, the amount of the polyfunctional vinyl aromatic copolymer (A) can be 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, or 30 wt %, or within a range between any two of the values described herein, but the present invention is not limited thereto.

The inventor found that the weight ratio of the polyfunctional vinyl aromatic copolymer (A) to the diene compound (B) that will be described below is preferably 5:1 to 1:2.5. For example, the weight ratio of the polyfunctional vinyl aromatic copolymer (A) to the diene compound (B) can be 5:1, 4.5:1, 4:1, 3.5:1, 3:1, 2.5:1, 2:1, 1.5:1, 1:1, 1:1.5, 1:2, or 1:2.5, or within a range between any two of the values described herein. If the weight ratio of the polyfunctional vinyl aromatic copolymer (A) to the diene compound (B) is not within the aforementioned range, phase separation occurs in the prepreg prepared from the resin composition, resulting in poor appearance.

1.2. (B) Diene Compound

As used herein, the diene compound (B) refers to an aromatic compound with two vinyl functional groups. The vinyl functional groups can react with the unsaturated functional group of other components. When the resin composition comprises the diene compound, the water absorption performance of the electronic materials prepared can be improved.

The diene compound (B) is represented by the following formula (I):

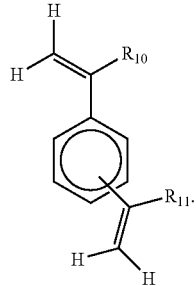

formula (I)

In formula (I), $R_{10}$ and $R_{11}$ are independently H, a C1-C6 linear or branched alkyl, with the proviso that $R_{10}$ and $R_{11}$ are not simultaneously H. $R_{10}$ and $R_{11}$ are preferably independently a C1-C6 linear or branched alkyl. Examples of linear alkyl include but are not limited to methyl, ethyl, propyl, butyl, and pentyl. Examples of branched alkyl include but are not limited to isopropyl, isobutyl, and isopentyl. In some embodiments of the present invention, $R_{10}$ is preferably methyl, ethyl, or propyl, more preferably methyl or ethyl, particularly preferably methyl; and $R_{11}$ is preferably methyl, ethyl or propyl, more preferably methyl or ethyl, particularly preferably methyl. When $R_{10}$ and $R_{11}$ are independently the aforementioned preferred embodiments, the electronic material prepared from the resin composition can have better glass transition temperature, dielectric properties, peeling strength, heat resistance, and water absorption performance.

Examples of the diene compound (B) include but are not limited to 1-isopropenyl-2-vinylbenzene, 1-isopropenyl-3-vinylbenzene, 1-isopropenyl-4-vinylbenzene, 1,2-diisopropenylbenzene, 1,3-diisopropenylbenzene, and 1,4-diisopropenylbenzene. Each of the aforementioned diene compounds can be used alone or in any combination. For example, a combination of 1,3-diisopropenylbenzene and 1,4-diisopropenylbenzene can be used. An example of a commercially available diene compound includes the product of model number IP-AMS available from Deltech Corporation.

Based on the solid content of the resin composition, the amount of the diene compound (B) can be 5 wt % to 35 wt %. For example, based on the solid content of the resin composition, the amount of the diene compound (B) can be 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, 30 wt %, 31 wt %, 32 wt %, 33 wt %, 34 wt %, or 35 wt %, or within a range between any two of the values described herein, but the present invention is not limited thereto.

1.3. Optional Components

Without departing from the technical principle of the present invention, the resin composition of the present invention may further comprise optional components, such as other components having unsaturated functional groups, or additives.

1.3.1. Other Components Having Unsaturated Functional Groups

Examples of other components having unsaturated functional groups include but are not limited to (C) a polyphenylene ether resin with unsaturated functional groups and (D) a compound having the structure of formula (III), which will be described below.

1.3.1.1. (C) Polyphenylene Ether Resin with Unsaturated Functional Groups

In some embodiments of the present invention, the resin composition can further comprise a polyphenylene ether resin (C) with unsaturated functional groups.

In some embodiments of the present invention, the polyphenylene ether resin (C) with unsaturated functional groups is represented by the following formula (II):

formula (II)

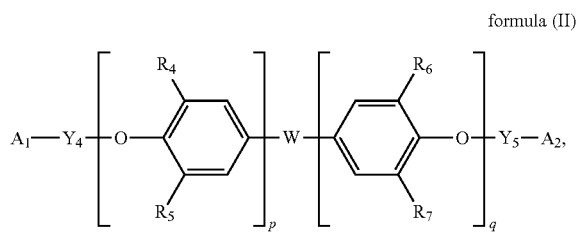

wherein, in formula (II), $R_4$, $R_5$, $R_6$ and $R_7$ are independently H, or a substituted or unsubstituted C1-C5 alkyl, and preferably are independently —$CH_3$; p and q are independently an integer from 0 to 100, with the proviso that p and q are not simultaneously 0; $Y_4$ and $Y_5$ are independently a direct bond, a carbonyl group, or an alkenyl-containing group, and preferably are independently a direct bond; $A_1$ and $A_2$ are independently

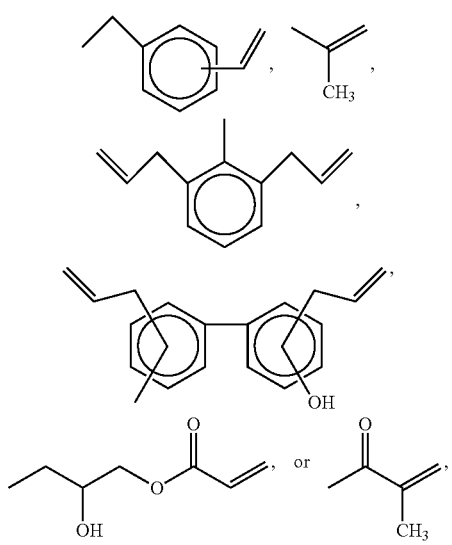

and preferably are independently

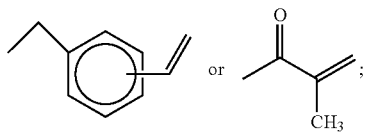

and W is a direct bond, —O—,

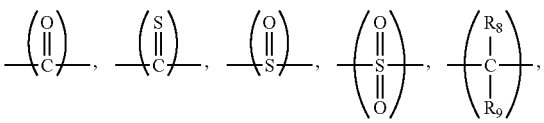

or an aryl, wherein $R_8$ and $R_9$ are independently H or a C1-C12 alkyl.

In some embodiments of the present invention, the polyphenylene ether resin (C) with unsaturated functional groups may comprise at least two polyphenylene ether resins represented by formula (II), wherein $A_1$ and $A_2$ are independently

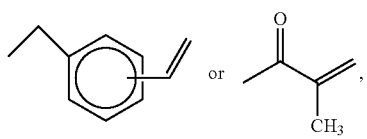

W is an aryl or

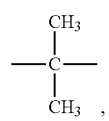

$Y_4$ and $Y_5$ are direct bonds, $R_4$, $R_5$, $R_6$ and $R_7$ are methyl, and $20 \leq (p+q) \leq 25$.

Examples of commercially available polyphenylene ether resin (C) with unsaturated functional groups include OPE-2st and OPE-2EA available from MITSUBISHI GAS CHEMICAL Company, SA-9000 available from SABIC Company, PP807 available from Chin Yee Chemical Industry Company, and a polyphenylene ether resin available from ASAHI KASEI Company.

In some embodiments of the present invention, based on the solid content of the resin composition, the amount of the polyphenylene ether resin (C) with unsaturated functional groups can be 1 wt % to 30 wt %. For example, based on the solid content of the resin composition, the amount of the polyphenylene ether resin (C) with unsaturated functional groups can be 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, 25 wt %, 26 wt %, 27 wt %, 28 wt %, 29 wt %, or 30 wt %, or within a range between any two of the values described herein, but the present invention is not limited thereto.

1.3.1.2. (D) Compound Having Structure of Formula (III)

The resin composition can further comprise compound (D) having the structure of formula (III):

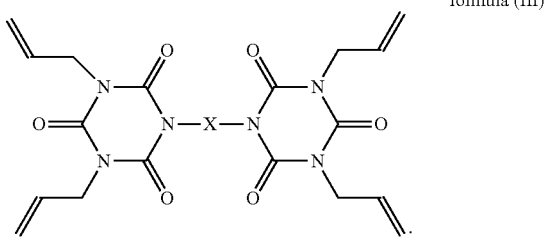

formula (III)

In formula (III), X is a C1-C10 linear or branched alkylene. As used herein, an "alkylene" or "alkylene chain" refers to a straight or branched divalent hydrocarbyl (alkyl) chain linking other parts of a molecule to another group and is consisting of carbon and hydrogen. Examples of the C1-C10 linear or branched alkylene include but are not limited to methylene, ethylene, n-propylene, isopropylene, n-butylene, isobutylene, sec-butylene, tert-butylene, n-pentylene, isopentylene, neopentylene, n-hexylene, isohexylene, n-heptylene, isoheptylene, n-octylene, isooctylene, n-nonylene, isononylene, n-decylene, and isodecylene.

Specific examples of the compound (D) having the structure of formula (III) include but are not limited to 1,1'-(1,1-methyl)bis(3,5-diallyl-1,3,5-triazine-2,4,6-trione), 1,1'-(1,2-ethyl)bis(3,5-diallyl-1,3,5-triazine-2,4,6-trione), 1,1'-(1,3-propyl)bis(3,5-diallyl-1,3,5-triazine-2,4,6-trione), 1,1'-(1,4-butyl)bis(3,5-diallyl-1,3,5-triazine-2,4,6-trione), 1,1'-(1,5-pentyl)bis(3,5-diallyl-1,3,5-triazine-2,4,6-trione), 1,1'-(1,6-hexyl)bis(3,5-diallyl-1,3,5-triazine-2,4,6-trione), 1,1'-(1,7-heptyl)bis(3,5-diallyl-1,3,5-triazine-2,4,6-trione), 1,1'-(1,8-octyl)bis(3,5-diallyl-1,3,5-triazine-2,4,6-trione), 1,1'-(1,9-nonyl)bis(3,5-diallyl-1,3,5-triazine-2,4,6-trione), 1,1'-(1,10-decyl)bis(3,5-diallyl-1,3,5-triazine-2,4,6-trione), and combinations thereof.

The compound (D) having the structure of formula (III) can be obtained by reacting diallyl isocyanurate with a hydrocarbyl halide in the presence of a catalyst. Examples of the hydrocarbyl halide include but are not limited to hydrocarbyl bromides, such as 2-bromomethane, 2-bromoethane, 2-bromopropane, 2-bromobutane, 2-bromopentane, 2-bromohexane, 2-bromoheptane, 2-bromooctane, 2-bromononane, and 2-bromodecane. Examples of the catalyst include but are not limited to potassium carbonate, potassium hydroxide, sodium carbonate, and sodium hydroxide. Detailed preparation of the compound will be illustrated in the appended Examples.

Based on the solid content of the resin composition, the amount of the compound (D) having the structure of formula (III) can be 1 wt % to 10 wt %. For example, based on the solid content of the resin composition, the amount of the compound (D) having the structure of formula (III) can be 1 wt %, 2 wt %, 3 wt %, 4 wt %, 5 wt %, 6 wt %, 7 wt %, 8 wt %, 9 wt %, or 10 wt %, or within a range between any two of the values described herein, but the present invention is not limited thereto.

In the resin composition of the present invention, the ratio of the diene compound (B) to the compound (D) having the structure of formula (III) is preferably 1:1 to 5:1. For example, the ratio of the diene compound (B) to the compound (D) having the structure of formula (III) can be 1:1, 1.5:, 2:1, 2.5:1, 3:1, 3.5:1, 4:1, 4.5:1, or 5:1, or within a range between any two of the values described herein. It is found that when the diene compound and the compound having the structure of formula (III) are used in the aforementioned preferred ratio, the resin composition has a better processibility (filling property).

1.3.2. Additives

The resin composition of the present invention may further comprise additives, such as catalysts, fillers, elastomers exemplified below and additives known in the art, to adaptively improve the processibility of the resin composition during the production process or to improve the physicochemical properties of the electronic materials prepared from the resin composition. Examples of the additives known in the art include but are not limited to dispersing agents, tougheners, viscosity modifiers, flame retardants, plasticizers, and coupling agents. Use of the additives is not a key feature of the present invention and can be carried out by persons having ordinary skill in the art based on the disclosure of the present invention as well as their ordinary skill.

1.3.2.1. Catalyst

The catalyst can be any component known in the art that can promote a cross-linking reaction. Examples of the catalyst include but are not limited to organic peroxides. Examples of the organic peroxides include but are not limited to dicumyl peroxide, tert-butyl peroxybenzoate, di-tert-amyl peroxide (DTAP), isopropylcumyl-tert-butyl peroxide, tert-butylcumylperoxide, di(isopropylcumyl) peroxide, di-tert-butyl peroxide, α,α'-bis(tert-butylperoxy) diisopropyl benzene, benzoyl peroxide (BPO), 1,1-bis(tert-butylperoxy)-3,3,5-trimethylcyclohexane, 4,4-di(tert-butylperoxy)butyl valerate, 2,5-dimethyl-2,5-di(tert-butylperoxy) hexane, and 2,5-dimethyl-2,5-di(tert-butylperoxy)-3-hexyne. The aforementioned organic peroxides can either be used alone or in any combination.

Based on the solid content of the resin composition, the amount of the catalyst can be 0.1 wt % to 1 wt %. For example, based on the solid content of the resin composition, the amount of the catalyst can be 0.1 wt %, 0.2 wt %, 0.3 wt %, 0.4 wt %, 0.5 wt %, 0.6 wt %, 0.7 wt %, 0.8 wt %, 0.9 wt %, or 1 wt %, or within a range between any two of the values described herein, but the present invention is not limited thereto.

1.3.2.2. Filler

Examples of the filler include but are not limited to silica (including hollow silica), aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like carbon, graphite, calcined kaolin, pryan, mica, hydrotalcite, polytetrafluoroethylene powders, glass beads, ceramic whiskers, carbon nanotubes, and nano-sized inorganic powders. Each of the mentioned fillers can be used alone or in any combination.

Based on the solid content of the resin composition, the amount of the filler can be 45 wt % to 60 wt %. For example, based on the solid content of the resin composition, the amount of the filler can be 45 wt %, 46 wt %, 47 wt %, 48 wt %, 49 wt %, 50 wt %, 51 wt %, 52 wt %, 53 wt %, 54 wt %, 55 wt %, 56 wt %, 57 wt %, 58 wt %, 59 wt %, or 60 wt %, or within a range between any two of the values described herein, but the present invention is not limited thereto.

1.3.2.3. Elastomer

An elastomer can improve the toughness of the prepared electronic materials. Examples of the elastomer include but are not limited to polybutadiene, styrene-butadiene copolymer, styrene-butadiene-divinylbenzene copolymer, polyisoprene, styrene-isoprene copolymer, acrylonitrile-butadiene copolymer, acrylonitrile-butadiene-styrene copolymer, functional modified derivatives of the preceding compounds, and combinations thereof. Examples of the aforementioned functional modified derivatives include but are not limited to maleic anhydride-modified polybutadiene and maleic anhydride-modified polybutadiene-styrene copolymer. In the appended Examples, styrene-butadiene copolymer and styrene-butadiene-divinylbenzene copolymer are used.

Based on the solid content of the resin composition, the amount of the elastomer can be 1 wt % to 25 wt %. For example, based on the solid content of the resin composition, the amount of the elastomer can be 1 wt %, 2 wt %, 3 wt %, 4 wt %, 5 wt %, 6 wt %, 7 wt %, 8 wt %, 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, 24 wt %, or 25 wt %, or within a range between any two of the values described herein, but the present invention is not limited thereto.

1.4. Preparation of Resin Composition

The resin composition of the present invention may be prepared into a varnish for subsequent processing by uniformly mixing the components of the resin composition, including the polyfunctional vinyl aromatic copolymer (A), the diene compound (B), and optional components (such as the polyphenylene ether resin (C) with unsaturated functional groups, the compound (D) having the structure of formula (III), and additives), with a stirrer, and dissolving or dispersing the resultant mixture in a solvent. The solvent can be any inert solvent that can dissolve or disperse the components of the resin composition but does not react with the components of the resin composition. Examples of the solvent that can dissolve or disperse the components of the resin composition include but are not limited to toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methylpyrrolidone (NMP). Each of the mentioned solvents can be used alone or in any combination. The content of the solvent in the resin composition is not limited as long as the components of the resin composition can be well dissolved or dispersed therein. In some embodiments of the present invention, the solvent is a mixture of methyl ethyl ketone (MEK) and toluene.

2. PREPREG

The present invention also provides a prepreg prepared from the aforementioned resin composition, wherein the prepreg is prepared by impregnating a substrate with the aforementioned resin composition or by coating the aforementioned resin composition onto a substrate and drying the impregnated or coated substrate. Examples of the substrate include but are not limited to papers, cloths, or mats made from a material selected from the group consisting of paper fibers, glass fibers, quartz fibers, organic polymer fibers, carbon fibers, and combinations thereof. Examples of the organic polymer fibers include but are not limited to high-modulus polypropylene (HMPP) fibers, polyamide fibers, ultra-high molecular weight polyethylene (UHMWPE), and liquid crystal polymer. The cloths made from the material selected from the aforementioned group can be woven or non-woven. In some embodiments of the present invention, 1078 reinforced glass fabric is used as a reinforcing material, and the resin composition is heated and dried at 175° C. for 2 to 15 minutes (B-stage) to prepare a semi-cured prepreg.

3. METAL-CLAD LAMINATE AND PRINTED CIRCUIT BOARD

The present invention also provides a metal-clad laminate prepared from the aforementioned prepreg. The metal-clad laminate comprises a dielectric layer and a metal layer, wherein the the aforementioned prepreg provides the dielectric layer. The metal-clad laminate can be prepared by superimposing a plurality of the aforementioned prepregs, superimposing a metal foil (such as a copper foil) on at least one external surface of the dielectric layer composed of the superimposed prepregs to provide a superimposed object, and then performing a hot-pressing operation to the superimposed object to obtain the metal-clad laminate. Alternatively, the metal-clad laminate can be prepared by coating the aforementioned resin composition directly on a metal foil and drying the coated metal foil. In addition, the external metal foil of the metal-clad laminate can be further subjected to patterning to prepare a printed circuit board.

4. EXAMPLES

4.1. Testing Methods

The present invention is further illustrated by the embodiments hereinafter, wherein the testing instruments and methods are as follows.

[Glass Transition Temperature (Tg) Test]

The laminate for evaluation is etched to remove the copper foils at both sides to obtain an unclad laminate. The unclad laminate is subjected to a glass transition temperature (Tg) test. Specifically, the Tg of the unclad laminate is determined using a dynamic mechanical analyzer of model number "Q800", available from TA Instruments. The testing conditions are as follows: the mode is bending mode, the frequency is 10 Hz, the heating rate is 5° C./min, and the dynamic viscoelasticity is measured during the course of heating from room temperature to 280° C. The Tg is the temperature at which tanδ in the resulting viscoelasticity curve is at maximum.

[Dielectric Constant (Dk) and Dielectric Loss Factor (Df) Measurement]

The dielectric constant (Dk) and dielectric loss factor (Df) are measured and calculated according to IPC-TM-650 2.5.5.13 standard under an operating frequency of 10 GHz.

[Peeling Strength Test]

The peeling strength refers to the adhesion of the metal foil to the dielectric layer. The peeling strength is expressed by the force required for vertically peeling a ⅛-inch-wide copper foil from the laminate. The unit of the peel strength is lbf/in.

[Filling Test]

A glass-fiber epoxy substrate with plated through holes formed by panel plating is prepared. The thickness of the substrate is 1.8 mm, and the diameter of each plating through hole is 0.9 mm. A 1078 NE-glass fiber fabric is impregnated or coated with the resin composition and dried at 175° C. for 2 to 5 minutes (B-stage) to obtain a semi-cured prepreg (having a resin content of 70% and a thickness of 0.88 mm).

After that, two prepregs are placed on one side of the glass-fiber epoxy substrate having through holes and then heated to 200° C. to 220° C. at a heating rate of 2 to 4° C./min, and hot-pressed and cured at the said temperature under full pressure of 18 kg/cm² (an initial pressure of 8 kg/cm²) to provide a sample for evaluation. The sample is placed under an optical microscope at a magnification of 100× to observe cross-sections of 588 filled plated through holes. The results are evaluated according to the following references. When all the plated through holes are completely filled, or only a few through holes (118 or less) are not completely filled, the filling property of the resin composition is suitable, and the result is recorded as "O". When the resin composition leaks from the bottom of the through holes or many of the through holes (more than 118) are not completely filled, the filling property of the resin composition is poor, and the result is recorded as "X".

[Heat Resistance After Moisture Absorption Test (PCT Heat Resistance Test)]

The heat resistance after moisture absorption is performed according to the method of JIS C5012 and is used to evaluate the thermal resistance of solder-floating after laying the laminate under an environment of a temperature of 60° C. and a relative humidity (RH) of 60% for 120 hours. The metal-clad laminate is subjected to solder-floating in a solder bath at a temperature of 288° C. for 60 seconds and then is inspected visually and by an optical microscope (a magnification of 5× to 1000× can be used) to see if there are deficiencies, such as measling or swelling. If no defects such as measling or swelling are found, the PCT thermal resistance test result is recorded as "O", meaning that the laminate passes the PCT thermal resistance test. If any defects such as measling or swelling are found, the PCT thermal resistance test result is recorded as "X", meaning that the laminate fails in the PCT thermal resistance test.

[Tackiness Test]

The impregnated or coated organic fiber woven fabric is dried under 175° C. for 2 to 5 minutes (B-stage) to obtain a semi-cured prepreg. After that, the stacking of the prepreg is observed by the unaided eye. If no spalling of powders or tacky phenomena is not found, the result is recorded as "O", meaning that the prepreg is not tacky and the processibility thereof is good; and if spalling or tacky phenomena is found, the result is recorded as "X", meaning that the prepreg is tacky and the processibility thereof is poor.

[Water Absorption Rate Test]

The water absorption rate test is conducted according to IPC-TM650 2.6.2.1. The prepreg is cut into a sample of 2 inch×2 inch and is dried and weighted (precisely weighted to 0.1 mg). After that, the sample is soaked in a distilled water bath at a constant temperature of 23±1.1° C. for 24 hours, and after water absorption is weighted again (precisely weighted to 0.1 mg). The ratio in the percentage of the difference between the weight of the sample after water absorption and the dry weight of the sample relative to the dry weight of the sample is the water absorption rate.

4.2. Preparation of the Compound Having the Structure of Formula (III)

[Synthesis Example 1]

0.2 mole of 2,4,6-triallyl-1,3,5-triazine, 1.49 g of copper chloride dehydrate, and 0.2 mole of allyl alcohol were dissolved in 80 mL of toluene, and were heated at a temperature of 112° C., refluxed for 2 hours, and then cooled for reprecipitation, followed by filtering with 2% HCl solution and drying to obtain 3,5-diallyl isocyanurate propylamine. 0.17 mole of the obtained 3,5-diallyl isocyanurate propylamine was added to 400 mL (0.2 mole) of an aqueous sodium hydroxide solution, reacted at a temperature of 70° C. for 1 hour and then cooled to room temperature, vacuum dried to remove moisture, and purified to obtain 3,5-diallyl isocyanurate propylamine sodium salt. All of the 3,5-diallyl isocyanurate propylamine sodium salt and 1,4-dichlorobutane in a molar ratio of 2:1 were dissolved in dimethylformamide, reacted at a temperature of 54° C. for 4 hours, cooled to room temperature, filtered to remove inorganic substances, dried and purified to obtain 1,1'-(1,4-butyl)bis(3,5-diallyl-1,3,5-triazine-2,4,6-trione) (hereinafter "Di-L-DAIC"). The structure of the obtained compound is shown below:

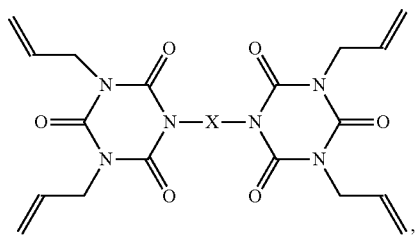

X = C₄ butylene.

3.3. Preparation of Resin Composition 3.3.1. List of Raw Materials Used in Examples and Comparative Examples

| Raw material | Description |
| --- | --- |
| ODV-XET-3 | Polyfunctional vinyl aromatic copolymer, available from Nippon Steel Chemical & Material Company, having a solid content of 50 wt %. |
| ODV-XET-4 | Polyfunctional vinyl aromatic copolymer, available from Nippon Steel Chemical & Material Company, having a solid content of 50 wt %. |
| IP-AMS | Compound of formula (II), 1,3-diisopropyl benzene, available from Deltech Corporation. |
| DVB | Divinylbenzene, available from Nippon Steel Chemical & Material Company. |
| TAIC | Triallyl isocyanurate, available from Evonik Company. |
| SA9000 | Polyphenylene ether resin with unsaturated functional groups, available from SABIC Company. |
| OPE-2st | Polyphenylene ether resin with unsaturated functional groups, available from Mitsubishi gas chemical Company, having a solid content of 63.5 wt %. |

-continued

| Raw material | Description |
|---|---|
| Di-L-DAIC | Compound having the structure of formula (III), prepared in Synthesis Example 1. |
| Ricon 100 | Elastomer, Styrene-butadiene copolymer, available from Cray Valley Company. |
| Ricon 257 | Elastomer, Styrene-butadiene-divinylbenzene copolymer, available from Cray Valley Company, having a solid content of 53 wt %. |
| Perbutyl P | Catalyst, available from NOF Corporation. |
| SC-5500 SVC | $SiO_2$ filler, available from Adamatechs Company. |

3.3.2. Preparation Method

According to the components and proportions shown in Table 1 and Table 2, the components were mixed using a stirrer at room temperature, methyl ethyl ketone (available from Methyl Company) and toluene (available from Trans Chief Chemical Industry Company) were added. Then the resultant mixture was stirred at room temperature for 60 to 120 minutes to obtain the resin compositions of Examples E1 to E14 and Comparative Examples CE1 to CE11.

TABLE 1

| Unit: parts by weight | | E1 | E2 | E3 | E4 | E5 | E6 | E7 | E8 | E9 | E10 | E11 | E12 | E13 | E14 |
|---|---|---|---|---|---|---|---|---|---|---|---|---|---|---|---|
| Polyfunctional vinyl aromatic copolymer | ODV-XET-3 | | 40 | | | | | | 60 | 40 | | | | | |
| | ODV-XET-4 | 60 | | 40 | 100 | 100 | 100 | 60 | | | 40 | 20 | 120 | 120 | 50 | 50 |
| Unsaturated compound | IP-AMS | 20 | 20 | 20 | 30 | 40 | 20 | 30 | 20 | 20 | 50 | 20 | 20 | 25 | 25 |
| | DVB | | | | | | | | | | | | | | |
| | TAIC | | | | | | | | | | | | | | |
| Polyphenylene ether resin with unsaturated functional groups | SA9000 | 40 | 50 | 30 | | | 20 | | 20 | | 10 | 10 | 10 | 50 | |
| | OPE-2st | | | | | | | | | 32 | | | | | |
| Compound having the structure of formula (III) | Di-L-DAIC | | | 20 | 10 | | | | | 10 | 20 | | 10 | | |
| Elastomer | Ricon 100 | | | | | | | | | 20 | | | | | |
| | Ricon 257 | 19 | 19 | 19 | 19 | 19 | 19 | 19 | 76 | 19 | 19 | 19 | 19 | 19 | 19 |
| Catalyst | Perbutyl P | 1 | 1 | 1 | 1 | 1 | 1 | 1 | 1 | 1 | 1 | 1 | 1 | 1 | 1 |
| Filler | SC-5500 SVC | 100 | 100 | 100 | 100 | 100 | 100 | 100 | 100 | 100 | 100 | 100 | 100 | 100 | 100 |

TABLE 2

| Unit: parts by weight | | CE1 | CE2 | CE3 | CE4 | CE5 | CE6 | CE7 | CE8 | CE9 | CE10 | CE11 |
|---|---|---|---|---|---|---|---|---|---|---|---|---|
| Polyfunctional vinyl aromatic copolymer | ODV-XET-3 | | | | | | | 40 | | 40 | | |
| | ODV-XET-4 | 40 | | 40 | 100 | 100 | 130 | | 100 | | | 100 |
| Unsaturated compound | IP-AMS | | 50 | | | | | | | | 50 | |
| | DVB | | | 10 | 40 | | | | | | | |
| | TAIC | 20 | | 10 | | 40 | | 50 | | 20 | | |
| Polyphenylene ether resin with unsaturated functional groups | SA9000 | 50 | 50 | 50 | | | | | 20 | | 20 | 50 |
| | OPE-2st | | | | | | 39 | | | | | |
| Compound having the structure of formula (III) | Di-L-DAIC | | | | | | | | | | | |
| Elastomer | Ricon 100 | | | 10 | 10 | | | | | | | |
| | Ricon 257 | 19 | 19 | | | 19 | 19 | 19 | 19 | 76 | 19 | 19 |
| Catalyst | Perbutyl P | 1 | 1 | 1 | 1 | 1 | 1 | 1 | 1 | 1 | 1 | 1 |
| Filler | SC-5500 SVC | 100 | 100 | 100 | 100 | 100 | 100 | 100 | 100 | 100 | 100 | 100 |

3.4. Preparation and Property Measurements of Metal-Clad Laminates

Metal-clad laminates of Examples E1 to E14 and Comparative Examples CE1 to CE11 were prepared respectively by using the resin compositions prepared. First, glass fiber cloths (Model No.: 1078; thickness: 0.043 mm) were impregnated in the resin compositions of Examples E1 to E14, and Comparative Examples CE1 to CE 11 through roll coaters the thicknesses of the glass fiber cloths were controlled to a proper extent. The impregnated glass fiber cloths were then placed in an oven, heated, and dried at 175° C. for 2 to 5 minutes to produce semi-cured (B-stage) prepregs (resin content: 70%). Afterward, several prepregs were superimposed, and two sheets of copper foils (each 0.5 oz.) were superimposed on the respective two surfaces of the outermost layers, and then the prepared objects were placed in a hot press machine to be cured through a high temperature hot-pressing. The hot-pressing conditions were as follows: heating to 200° C. to 220° C. at a heating rate of 2° C./min to 4° C./min, and hot-pressing at 200° C. to 220° C. for 120 minutes under a full pressure of 18 kg/cm$^2$ (the initial pressure was 8 kg/cm$^2$).

The properties of the metal-clad laminates of Examples E1 to E14 and Comparative Examples CE1 to CE11, including glass transition temperature (Tg), dielectric constant (Dk), dielectric loss factor (Df), peeling strength, PCT heat resistance, and processing stability (including filling and tackiness properties), were tested according to the aforementioned testing methods, and the results are tabulated in Table 3 and Table 4.

TABLE 3

|  | E1 | E2 | E3 | E4 | E5 | E6 | E7 |
|---|---|---|---|---|---|---|---|
| Tg (° C.) | 250 | 244 | 245 | 240 | 247 | 243 | 240 |
| Dk (10 GHz) | 3.2 | 3.2 | 3.1 | 3.0 | 3.0 | 3.1 | 3.2 |
| Df (10 GHz) | 0.0015 | 0.0017 | 0.0015 | 0.0014 | 0.0011 | 0.0015 | 0.0014 |
| Peeling strength (lbf/in) | 4.2 | 4.0 | 4.4 | 4.2 | 4.6 | 4.1 | 4.0 |
| Filling test | ○ | ○ | ○ | ○ | ○ | ○ | ○ |
| PCT heat resistance | ○ | ○ | ○ | ○ | ○ | ○ | ○ |
| Tackiness test | ○ | ○ | ○ | ○ | ○ | ○ | ○ |
| Water absorption rate | 0.15 | 0.17 | 0.15 | 0.14 | 0.12 | 0.17 | 0.14 |

|  | E8 | E9 | E10 | E11 | E12 | E13 | E14 |
|---|---|---|---|---|---|---|---|
| Tg (° C.) | 221 | 235 | 243 | 24 | 242 | 245 | 243 |
| Dk (10 GHz) | 3.0 | 3.1 | 3.1 | 3.1 | 3.0 | 3.2 | 3.0 |
| Df (10 GHz) | 0.0015 | 0.0017 | 0.0015 | 0.0013 | 0.0014 | 0.0015 | 0.0013 |
| Peeling strength (lbf/in) | 4.0 | 4.1 | 4.4 | 4.0 | 4.2 | 4.2 | 4.3 |
| Filling test | ○ | ○ | ○ | ○ | ○ | ○ | ○ |
| PCT heat resistance | ○ | ○ | ○ | ○ | ○ | ○ | ○ |
| Tackiness test | ○ | ○ | ○ | ○ | ○ | ○ | ○ |
| Water absorption rate | 0.16 | 0.17 | 0.15 | 0.16 | 0.14 | 0.15 | 0.12 |

TABLE 4

|  | CE1 | CE2 | CE3 | CE4 | CE5 | CE6 | CE7 | CE8 | CE9 | CE10 | CE11 |
|---|---|---|---|---|---|---|---|---|---|---|---|
| Tg (° C.) | 210 | 214 | 231 | 199 | 188 | 178 | 199 | 154 | 187 | NA* | 179 |
| Dk (10 GHz) | 3.1 | 3.2 | 3.2 | 3.2 | 3.2 | 3.1 | 3.3 | 2.9 | 3.0 | NA | 3.0 |
| Df (10 GHz) | 0.0016 | 0.0017 | 0.0018 | 0.0015 | 0.0015 | 0.0014 | 0.0019 | 0.0013 | 0.0016 | NA | 0.0015 |
| Peeling strength (lbf/in) | 3.1 | 3.5 | 3.6 | 2.4 | 2.5 | 2.3 | 4.3 | 2.1 | 2.7 | NA | 2.4 |
| Filling test | ○ | X | X | X | ○ | ○ | ○ | ○ | ○ | NA | ○ |
| PCT heat resistance | ○ | ○ | ○ | ○ | X | X | X | X | X | NA | X |
| Tackiness test | ○ | ○ | ○ | ○ | X | X | X | X | X | NA | X |
| Water absorption rate | 0.27 | 0.23 | 0.25 | 0.22 | 0.21 | 0.23 | 0.24 | 0.20 | 0.25 | NA | 0.25 |

*NA means that the resin composition cannot be made into a prepreg, and therefore properties of a prepreg cannot be measured.

As shown in Table 3 and Table 4, the metal-clad laminates prepared from the resin compositions of the present invention have outstanding temperature transition temperature (Tg), dielectric constant (Dk), dielectric loss factor (Df), peeling strength, PCT heat resistance, and processing stability (including filling and tackiness properties). By contrast, Comparative Examples CE1, CE3 to CE5, CE7, and CE9 show that if an unsaturated monomer different from the diene compound (B) of formula (I) is used, the aforementioned outstanding properties cannot be obtained simultaneously. Comparative Examples CE2 and CE10 show that if the polyfunctional vinyl aromatic copolymer (A) is not used, the aforementioned outstanding properties cannot be obtained simultaneously. Comparative Examples CE6, CE8, and CE11 show that if the diene compound (B) of formula (I) is not used, the aforementioned outstanding properties cannot be obtained simultaneously.

In particular, the comparison between Example E5 and Comparative Examples CE4 and CE5 shows that under the conditions that identical amounts of the poly functional vinyl aromatic copolymer and unsaturated compound are used in the examples and comparative examples, the inventive efficacy cannot be achieved if divinylbenzene (DVB) or triallyl isocyanurate (TAIC) is used as the unsaturated compound. The comparison between Example E13 and Comparative Examples CE2 and CE11 and the comparison between Example E14 and Comparative Examples CE8 and CE10 show that, regardless of the use of the polyphenylene ether resin (C) with unsaturated functional groups, the inventive efficacy cannot be achieved if the resin composition does not include one of the polyfunctional vinyl aromatic copolymer (A) and the compound (B) of formula (I). The composition of Comparative Example CE10 cannot even successfully provide a prepreg.

The above examples illustrate the principle and efficacy of the present invention and show the inventive features thereof. People skilled in this field may proceed with a variety of modifications and replacements based on the disclosures and suggestions of the invention as described without departing from the principle thereof. Therefore, the scope of protection of the present invention is as defined in the claims as appended.

What is claimed is:

1. A resin composition, which comprises:
(A) a polyfunctional vinyl aromatic copolymer; and
(B) a diene compound, represented by the following formula (I),

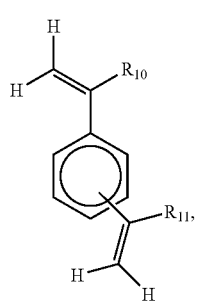

formula (I)

wherein, in formula (I), $R_{10}$ and $R_{11}$ are independently H, a C1-C6 linear or branched alkyl, with the proviso that $R_{10}$ and $R_{11}$ are not simultaneously H; and the polyfunctional vinyl aromatic copolymer (A) is prepared by copolymerizing one or more divinyl aromatic compounds with one or more monovinyl aromatic compounds.

2. The resin composition of claim 1, wherein the weight ratio of the polyfunctional vinyl aromatic copolymer (A) to the diene compound (B) is 5:1 to 1:2.5.

3. The resin composition of claim 1, wherein the polyfunctional vinyl aromatic copolymer (A) comprises a structural unit selected from the group consisting of

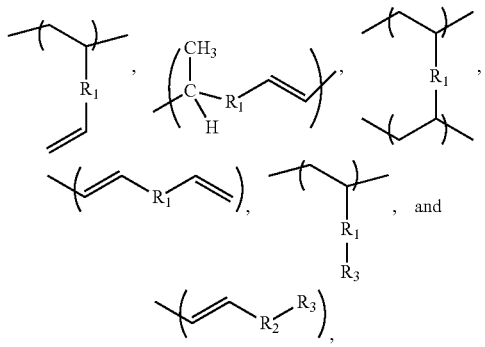

wherein $R_1$ and $R_2$ are independently a C6-C12 aromatic hydrocarbyl, and $R_3$ is H or a C1-C12 hydrocarbyl.

4. The resin composition of claim 1, wherein the divinyl aromatic compound is selected from the group consisting of divinylbenzene, divinylnaphthalene, divinylbiphenyl, and isomers of the preceding compounds.

5. The resin composition of claim 1, wherein the monovinyl aromatic compound is selected from the group consisting of nuclear-alkyl-substituted vinyl aromatic compound, α-alkyl-substituted vinyl aromatic compound, β-alkyl-substituted vinyl aromatic compound, and alkoxyl-substituted vinyl aromatic compound, and combinations thereof.

6. The resin composition of claim 1, wherein the diene compound is selected from the group consisting of 1-isopropenyl-2-vinylbenzene, 1-isopropenyl-3-vinylbenzene, 1-isopropenyl-4-vinylbenzene, 1,2-diisopropenylbenzene, 1,3-diisopropenylbenzene, 1,4-diisopropenylbenzene, and combinations thereof.

7. The resin composition of claim 1, further comprising:
(C) a polyphenylene ether resin with unsaturated functional groups represented by the following formula (II):

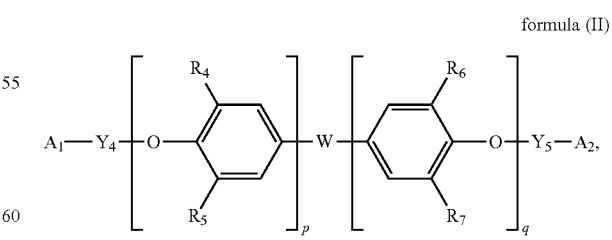

formula (II)

wherein, in formula (II),
$R_4$, $R_5$, $R_6$ and $R_7$ are independently H, or a substituted or unsubstituted C1-C5 alkyl;
p and q are independently an integer from 0 to 100, with the proviso that p and q are not 0 at the same time;

Y$_4$ and Y$_5$ are independently a direct bond, a carbonyl group, or an alkenyl-containing group;

A$_1$ and A$_2$ are independently

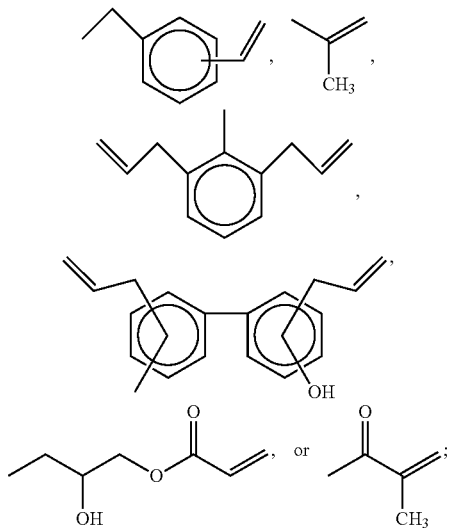

and

W is a direct bond, —O—,

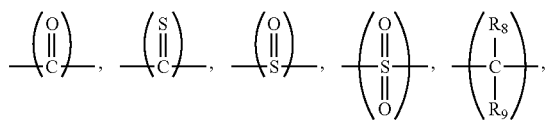

or an aryl, wherein R$_8$ and R$_9$ are independently H or a C1-C12 alkyl.

8. The resin composition of claim 1, further comprising: (D) a compound having the structure of formula (III),

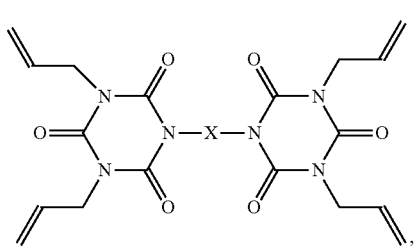

formula (III)

wherein, in formula (III), X is a C1-C10 linear or branched alkylene.

9. The resin composition of claim 1, further comprising an additive selected from the group consisting of catalysts, elastomers, fillers, dispersing agents, tougheners, viscosity modifiers, flame retardants, plasticizers, coupling agents, and combinations thereof.

10. The resin composition of claim 9, wherein the catalyst is selected from the group consisting of dicumyl peroxide, tert-butyl peroxybenzoate, di-tert-amyl peroxide (DTAP), isopropylcumyl-tert-butyl peroxide, tert-butylcumylperoxide, di(isopropylcumyl) peroxide, di-tert-butyl peroxide, α,α'-bis(tert-butylperoxy)diisopropyl benzene, benzoyl peroxide (BPO), 1,1-bis(tert-butylperoxy)-3,3,5-trimethylcyclohexane, 4,4-di(tert-butylperoxy)butyl valerate, 2,5-dimethyl-2,5-di(tert-butylperoxy)hexane, 2,5-dimethyl-2,5-di(tert-butylperoxy)-3-hexyne, and combinations thereof.

11. The resin composition of claim 9, wherein the elastomer is selected from the group consisting of polybutadiene, styrene-butadiene copolymer, styrene-butadiene-divinylbenzene copolymer, polyisoprene, styrene-isoprene copolymer, acrylonitrile-butadiene copolymer, acrylonitrile-butadiene-styrene copolymer, functional modified derivatives of the preceding compounds, and combinations thereof.

12. The resin composition of claim 9, wherein the filler is selected from the group consisting of silica, aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like carbon, graphite, calcined kaolin, pryan, mica, hydrotalcite, polytetrafluoroethylene powders, glass beads, ceramic whiskers, carbon nanotubes, nanosized inorganic powders, and combinations thereof.

13. A prepreg, which is prepared by impregnating a substrate with the resin composition of claim 1 or by coating the resin composition of claim 1 onto a substrate and drying the impregnated or coated substrate.

14. A metal-clad laminate, which is prepared by laminating the prepreg of claim 13 and a metal foil.

15. A printed circuit board, which is prepared from the metal-clad laminate of claim 14.

16. A metal-clad laminate, which is prepared by coating the resin composition of claim 1 onto a metal foil and drying the coated metal foil.

17. A printed circuit board, which is prepared from the metal-clad laminate of claim 16.

* * * * *